(12) United States Patent
Hu et al.

(10) Patent No.: US 11,094,669 B2
(45) Date of Patent: Aug. 17, 2021

(54) WAFER LEVEL MOLDED PPGA (PAD POST GRID ARRAY) FOR LOW COST PACKAGE

(71) Applicant: Dialog Semiconductor B.V., s-Hertogenbosch (NL)

(72) Inventors: Shou Cheng Eric Hu, Taichung (TW); Jesus Mennen Belonio, Jr., Neubiberg (DE)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/503,413

(22) Filed: Jul. 3, 2019

(65) Prior Publication Data

US 2019/0326254 A1 Oct. 24, 2019

Related U.S. Application Data

(62) Division of application No. 15/835,580, filed on Dec. 8, 2017, now abandoned.

(51) Int. Cl.
*H01L 23/00* (2006.01)
*H01L 21/56* (2006.01)
*H01L 23/31* (2006.01)

(52) U.S. Cl.
CPC ........... *H01L 24/94* (2013.01); *H01L 21/561* (2013.01); *H01L 24/11* (2013.01); *H01L 24/13* (2013.01);
(Continued)

(58) Field of Classification Search
CPC ..... H01L 2224/73265; H01L 2924/014; H01L 2924/15311; H01L 2224/16225; H01L 2224/0401; H01L 2224/12105; H01L 24/94; H01L 21/561; H01L 24/96; H01L 24/11; H01L 24/13; H01L 2224/03912; H01L 2224/13022; H01L 2224/05647; H01L 2224/94; H01L 2224/05666; H01L 2224/05569; H01L 2224/16227; H01L 2224/11622; H01L 23/3114; H01L 2224/11424; H01L 2224/11462; H01L 2224/13024; H01L 2224/13644; H01L 2224/13564; H01L 2224/1369; H01L 2224/13611; H01L 2224/13147
(Continued)

(56) References Cited

U.S. PATENT DOCUMENTS 6,784,535 B1 8/2004 Chiu
7,525,167 B2 4/2009 Shizuno
(Continued)

*Primary Examiner* — Jonathan Han
(74) *Attorney, Agent, or Firm* — Saile Ackerman LLC; Stephen B. Ackerman; Rosemary L. S. Pike

(57) ABSTRACT

A method to fabricate a land grid array wafer level chip scale package is described. A silicon die is provided. A dielectric layer is deposited on the silicon die. An opening is etched through the dielectric layer to a metal pad on the silicon die. At least one redistribution layer is formed over the dielectric layer and contacting the metal pad. At least one copper post is formed on the at least one redistribution layer and forms a land grid array. The wafer is sawed partially through on scribe lines to form cuts exposing sides of the silicon die. Thereafter, a molding compound is applied over the at least one redistribution layer and in the cuts wherein the molding compound encapsulates top and side surfaces of the silicon die.

15 Claims, 3 Drawing Sheets

(52) U.S. Cl.
CPC .......... *H01L 24/96* (2013.01); *H01L 23/3114* (2013.01); *H01L 2224/03912* (2013.01); *H01L 2224/0401* (2013.01); *H01L 2224/05569* (2013.01); *H01L 2224/05647* (2013.01); *H01L 2224/05666* (2013.01); *H01L 2224/11424* (2013.01); *H01L 2224/11462* (2013.01); *H01L 2224/11622* (2013.01); *H01L 2224/12105* (2013.01); *H01L 2224/13022* (2013.01); *H01L 2224/13024* (2013.01); *H01L 2224/1369* (2013.01); *H01L 2224/13147* (2013.01); *H01L 2224/13564* (2013.01); *H01L 2224/13611* (2013.01); *H01L 2224/13644* (2013.01); *H01L 2224/16227* (2013.01); *H01L 2224/94* (2013.01)

(58) Field of Classification Search
USPC ......... 257/737, 686, 774, E21.295; 438/126, 438/613, 614
See application file for complete search history.

(56) References Cited

U.S. PATENT DOCUMENTS

| | | |
|---|---|---|
| 8,587,123 B2 | 11/2013 | Law et al. |
| 9,312,198 B2 | 4/2016 | Meyer et al. |
| 9,431,332 B2 | 8/2016 | Park |
| 9,520,342 B2 | 12/2016 | Michael et al. |
| 2011/0260317 A1* | 10/2011 | Lu ............................ H01L 24/11 257/737 |
| 2013/0056879 A1* | 3/2013 | Lin ...................... H01L 23/5226 257/774 |
| 2014/0183731 A1* | 7/2014 | Lin .......................... H01L 24/97 257/738 |
| 2014/0284791 A1* | 9/2014 | Do ........................ H01L 21/683 257/737 |
| 2015/0179570 A1* | 6/2015 | Marimuthu ......... H01L 25/0655 257/774 |

* cited by examiner

WAFER LEVEL MOLDED PPGA (PAD POST GRID ARRAY) FOR LOW COST PACKAGE

This is a divisional application of U.S. Ser. No. 15/835,580 filed on Dec. 8, 2017, assigned to the same assignee as the instant application, and which is herein incorporated by reference in its entirety.

(1) TECHNICAL FIELD

This disclosure is related to wafer packaging technologies, and more particularly, to improved wafer level chip scale packaging.

(2) BACKGROUND

Solder balls as a BGA (ball grid array) in current wafer level chip scale packages (WLCSP), also known as wafer level ball grid array (WLBGA) packages, are used to connect to a PCB (printed circuit board). Extra tooling (stencil) and processes including ball placement, flux printing, clean, and reflow need to be implemented to prepare solder balls.

U.S. Pat. No. 9,520,342 (Michael et al), U.S. Pat. No. 9,312,198 (Meyer et al), U.S. Pat. No. 8,587,123 (Law et al), U.S. Pat. No. 9,431,332 (Park), U.S. Pat. No. 7,525,167 (Shizuno), and U.S. Pat. No. 6,784,535 (Chiu) show various types of packages.

SUMMARY

It is the primary objective of the present disclosure to provide a wafer level chip scale package with land grid array (LGA) connection to a printed circuit board (PCB).

It is another objective of the disclosure to provide a wafer level chip scale package with land grid array (LGA) connection to a printed circuit board (PCB), copper post structure for fine pitch, and molding compound for protection of the package.

It is a further objective of the disclosure to provide a process for fabricating a wafer level chip scale package with land grid array (LGA) connection to a printed circuit board (PCB), copper post structure for fine pitch, and molding compound for protection of the package.

In accordance with the objectives of the present disclosure, a land grid array wafer level chip scale package is achieved. The package comprises a silicon die at a bottom of the package, at least one redistribution layer connected to the silicon die through an opening through a dielectric layer to a metal pad on a top surface of the silicon die, at least one copper post contacting the at least one redistribution layer and forming a land grid array, and a molding compound on the redistribution layer encapsulating top and side surfaces of the silicon die.

Also in accordance with the objectives of the present disclosure, a method to fabricate a land grid array wafer level chip scale package is achieved. A silicon die is provided. A dielectric layer is deposited on the silicon die. An opening is etched through the dielectric layer to a metal pad on the silicon die. At least one redistribution layer is formed over the dielectric layer and contacting the metal pad. At least one copper post is formed on the at least one redistribution layer and forms a land grid array. The wafer is sawed partially through on scribe lines to form cuts exposing sides of the silicon die. Thereafter, a molding compound is applied over the at least one redistribution layer and in the cuts wherein the molding compound encapsulates top and side surfaces of the silicon die.

BRIEF DESCRIPTION OF THE DRAWINGS

In the accompanying drawings forming a material part of this description, there is shown.

DETAILED DESCRIPTION

The present disclosure describes a structure and a process in which the ball grid array (BGA) in a wafer level chip scale package (WLCSP) is replaced by a land grid array (LGA) to reduce the package cost and process cycle time. Furthermore, a Cu post structure replaces under bump metal (UBM) to achieve the "fine pitch" requirement and to enhance electrical performance needed by power management integrated circuits (PMIC). In addition, extra molding compound is used to protect the redistribution layer (RDL) and to prevent side wall silicon chipping.

Other advantages of WLCSP of the present disclosure include:
1. Lower package cost.
2. Reduced process cycle time (time to market early).
3. Fine pitch application.
4. Improved package reliability with lower package stand-off height and molding compound side wall protection.

Figure 1:
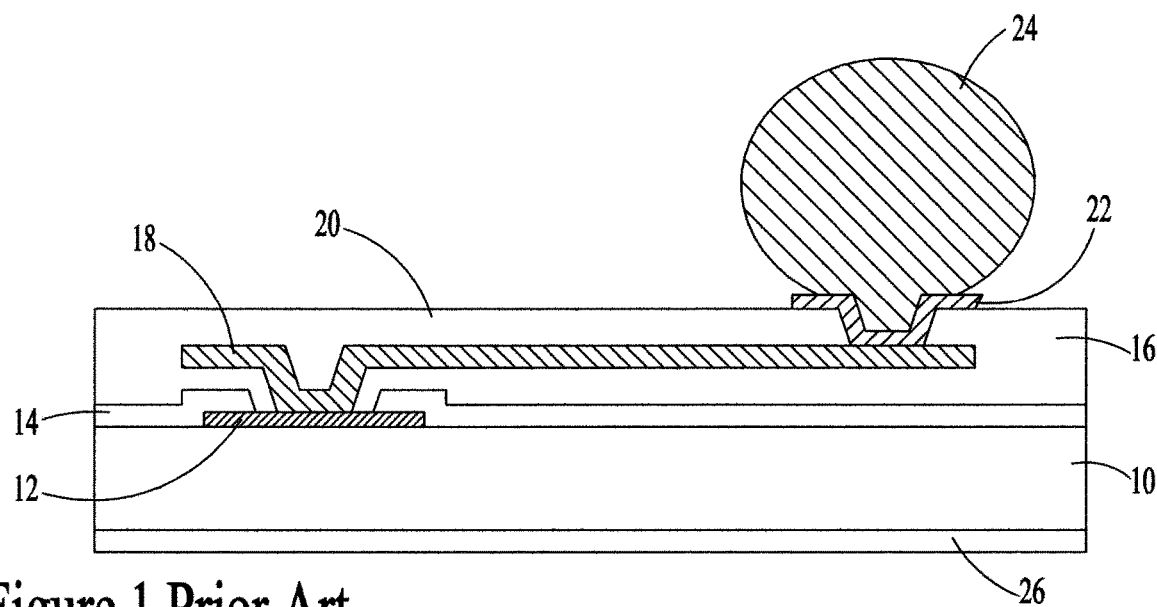
FIG. 1 is a cross-sectional representation of wafer level chip scale package of the prior art.

FIG. 1 illustrates a traditional WLCSP (WLBGA) in the production stage. An opening is made to the aluminum pad 12 on the die 10 through the die passivation layer 14. First dielectric layer 16 is deposited, then patterned to provide an opening for the RDL layer 18. Second dielectric layer 20 is deposited over the patterned RDL. Dielectric layer 20 is patterned to form an opening for the UBM 22 which is also patterned. Solder ball 24 is placed onto the UBM. There are total of four photo masks (dielectric layer 1, RDL, dielectric layer 2, UBM) and two stencils (flux & ball) required to complete this package.

Figure 2:
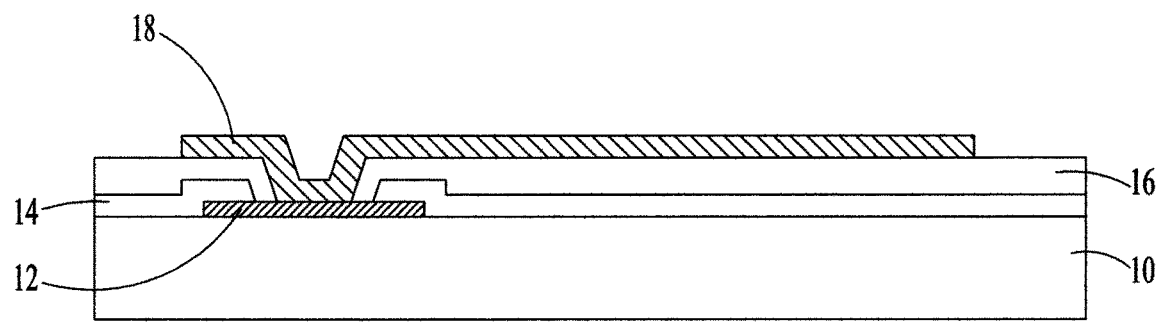
FIGS. 2-8 are cross-sectional representations of a wafer level chip scale package of the present disclosure.
Figure 3:
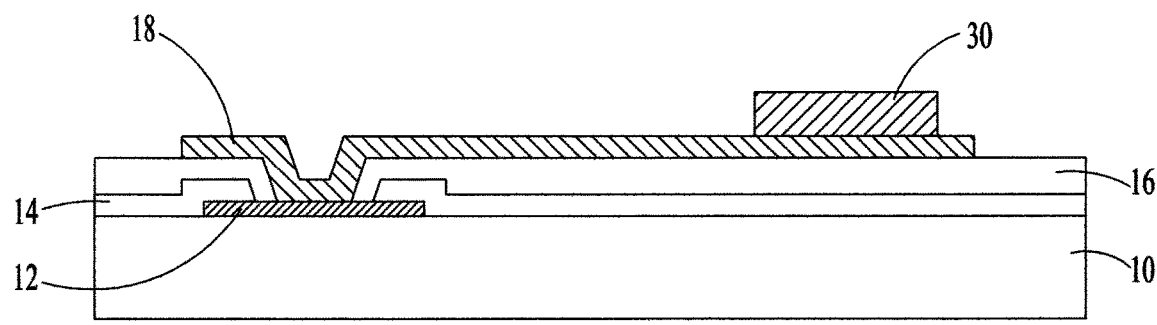

Referring now to FIGS. 2-8, the process of fabricating a WLCSP of the present disclosure will be described in detail. As illustrated in FIG. 2, the package of the present disclosure is fabricated similarly to the traditional package. An opening is made to the aluminum pad 12 on the die 10 through the die passivation layer 14. First dielectric layer 16 is deposited, then patterned to provide an opening for the RDL layer 18. RDL layer 18 is patterned as shown in FIG. 2.

In a departure from the traditional process, copper (Cu) posts 30 are formed on the RDL layer 18. A seed layer, not shown, is deposited over the RDL layer 18. Preferably, the seed layer will be titanium or copper. A photoresist mask is formed with openings where copper posts are to be placed. Copper posts 30 are plated onto the seed layer in the openings. The mask is stripped and the seed layer not covered by the copper is etched away. The copper posts form a land grid array.

Figure 4:
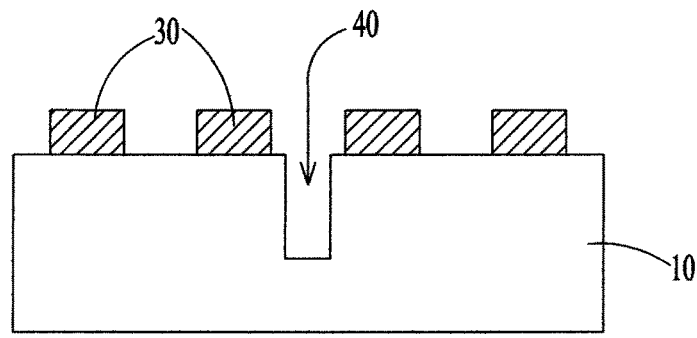
Figure 6:
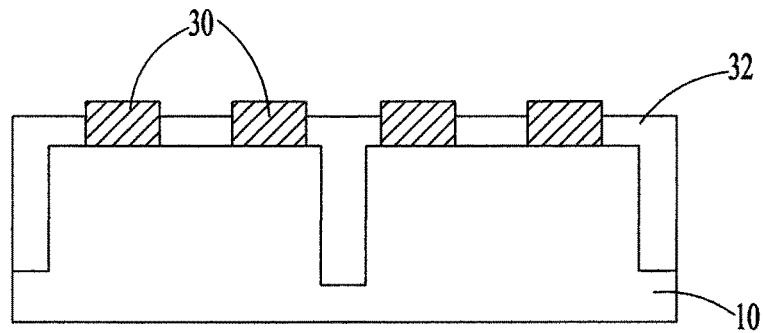

Now, a half-cut process on the scribe line area is applied, as shown in FIG. 4. Cut 40 extends partially through the wafer. A molding compound 32 is coated over the wafer. The cut 40 allows the molding compound to surround the die as shown in FIG. 6. The four sides and top of the die are protected by the molding compound for better package level and board level reliability.

The die is molded or encapsulated by a compression method using mold granular epoxy resin material with a fine filler to serve as the mold underfill. For example, the molding 32 is cured at about 175° C. for about 120 seconds. The molding thickness is preferably about 150 to 1000 µm. To finish cross-linking, the molding is post-cured at about 175° C. for about 6 hours, for example, depending on the particular molding compound.

Figure 5:
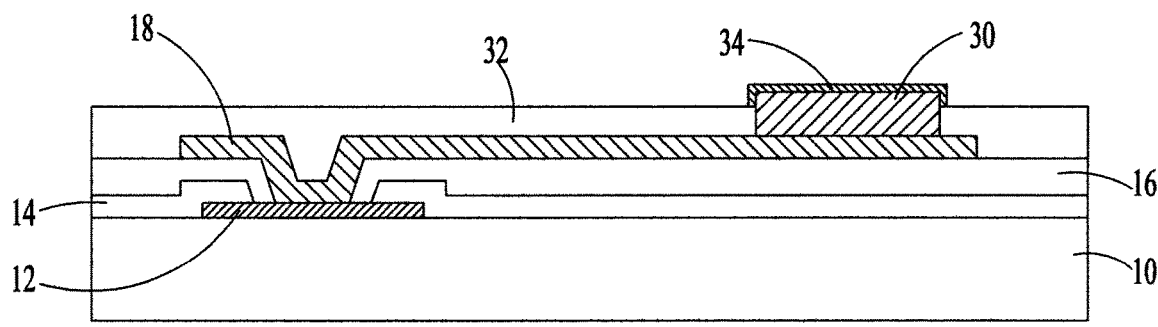

The molding compound protects the package sidewalls for better reliability. As shown in FIG. 5, the RDL layer 18 is covered by the molding compound as surface protection. The Cu post 30 height can be controlled to be below, at, or above the molding compound surface. If the Cu post is to be at or below the molding compound, a lapping process is performed to expose the Cu post.

If the copper post is to be exposed, as shown in FIG. 5, an extra layer such as organic solderability preservatives (OSP), immersion tin (IT), or an electroplated gold layer 34 is coated, printed, or plated onto the exposed Cu post surfaces to prevent pad oxidation prior to the surface mount technology (SMT) process onto the printed circuit board (PCB).

Figure 7:
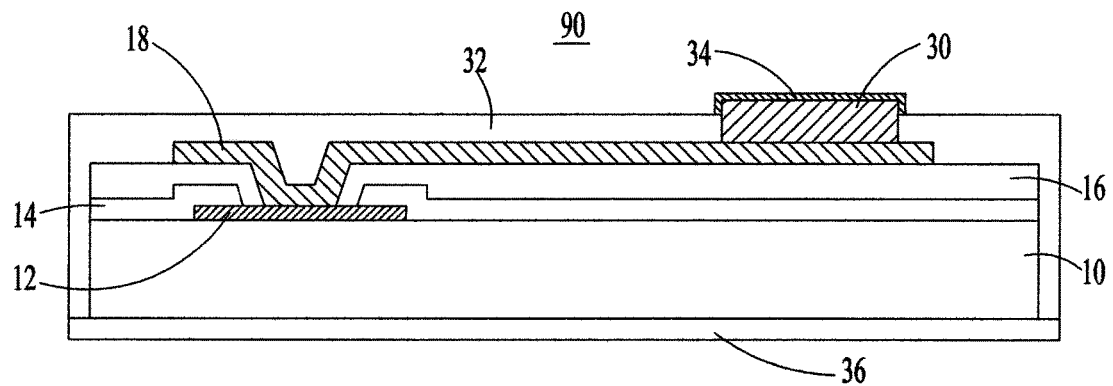

Next, the backside of the wafer is thinned. As shown in FIG. 7, an optional backside film 36 may be laminated onto the backside of the wafer. The backside, such as an epoxy material, is laminated onto the wafer backside and cured, for example, at 130° C. for 2 hours. The extra backside film 35 protects the silicon backside and edge from chipping caused by the wafer die saw process. With the backside film 36, the die is protected on all six sides.

Figure 8:
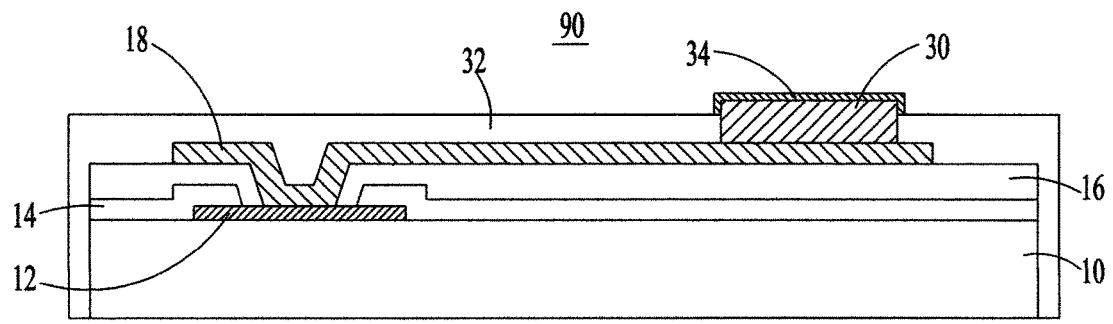

The wafer is now singulated into package form. FIG. 7 shows the competed package 90 with the optional backside film 36. FIG. 8 shows the completed package 90 without the optional backside film.

Figure 9:
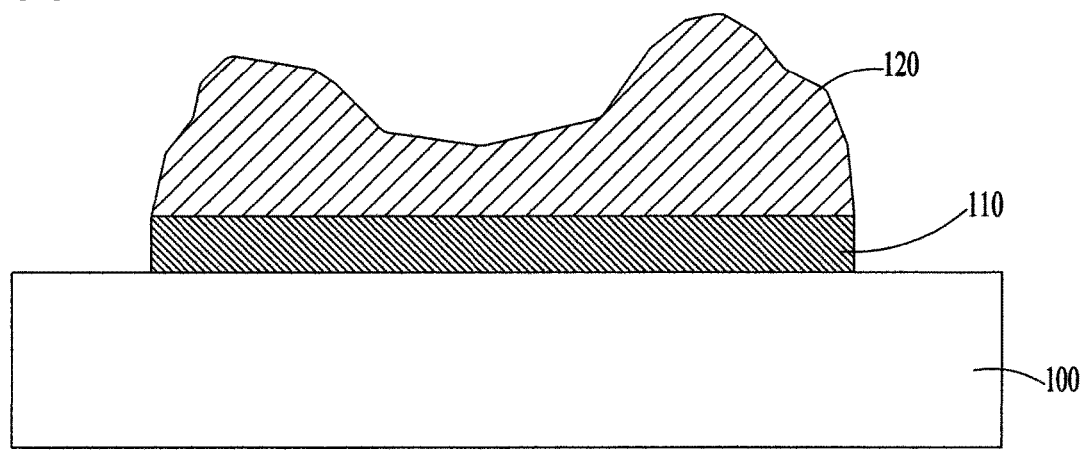
FIG. 9 is a cross-sectional representation of the attachment structures between a wafer level chip scale package of the present disclosure and a printed circuit board.

In backend processing, the wafer is prepared for connection to a printed circuit board. In the process of the present disclosure, copper posts 30 comprise a land grid array for attaching a printed circuit board (PCB). FIG. 9 illustrates a PCB 100 having a pad 110. Solder paste 120 printing volume can be controlled by solder paste stencil aperture sizes and thickness design to get a better solder joint where the solder paste 120 bonds with the landing pad 30 of the package 90 of the present disclosure.

LGA devices of the present disclosure can be used for either lead containing or lead-free assemblies depending on the surface mount technology (SMT) assembly solder paste used. LGA eliminates risk that customers receive components with missing or damaged spheres (solder balls) due to shipping or handling. LGA devices have a lower mounted height than BGA. This can allow for more space above the device for a heat sink solution or for small form-factor applications. A WLCSP fabricated according to the process of the present disclosure results in a board-level reliability significantly exceeding customer requirements.

The WLCSP of the present disclosure includes a molding compound in place of the second dielectric layer of the traditional process. This saves a patterning step and also provides sidewall protection of the wafer. Replacing the traditional UBM with Cu posts improves the electrical performance and allows for fine pitch applications. Replacing BGA with LGA saves package cost and process cycle time as well as reducing the package height.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method of fabricating a land grid array wafer level chip scale package comprising:
   providing at least one silicon die on a wafer;
   depositing a dielectric layer on said silicon die;
   etching an opening through said dielectric layer to a metal pad on said silicon die;
   forming at least one redistribution layer over said dielectric layer and contacting said metal pad;
   forming at least one copper post on said at least one redistribution layer forming said land grid array;
   cutting said wafer partially through on scribe lines to form cuts exposing sides of said silicon die;
   thereafter applying a molding compound over said at least one redistribution layer and in said cuts wherein said molding compound encapsulates top and side surfaces of said silicon die; and
   thereafter cutting sais wafer all the way through on said scribe lines, thereby singulating said wafer to form packages.

2. The method according to claim 1 wherein said applying said molding compound comprises:
   compression molding using a mold granular epoxy resin material with a fine filler;
   curing; and
   post-curing said mold material.

3. The method according to claim 1 further comprising:
   lapping said wafer to expose said at least one copper post; and
   forming an oxidation preventing layer on exposed said at least one copper post.

4. The method according to claim 3 wherein said oxidation preventing layer comprises organic solderability preservatives (OSP), immersion tin (IT), or electroplated gold coated, printed, or plated onto said exposed at least one copper post.

5. The method according to claim 1 further comprising:
   thinning a backside of said wafer prior to said singulating said wafer to form packages.

6. The method according to claim 5 further comprising laminating a backside protection film onto thinned said backside of said wafer prior to said singulating step.

7. The method according to claim 6 wherein said backside protection film comprises epoxy.

8. The method according to claim 1 further comprising:
   providing at least one pad on a printed circuit board
   applying solder paste on said at least one pad; and
   surface mounting said at least one copper post of said wafer level chip scale package to said at least one pad on said printed circuit board via said solder paste.

9. The method according to claim 1 further comprising:
   providing at least one pad on a printed circuit board
   applying solder paste on said at least one pad; and
   surface mounting said at least one copper post of said wafer level chip scale package to said at least one pad on said printed circuit board via said solder paste.

10. A method of fabricating a land grid array wafer level chip scale package comprising:
    providing at least one silicon die on a wafer;
    depositing a dielectric layer on said silicon die;
    etching an opening through said dielectric layer to a metal pad on said silicon die;
    forming at least one redistribution layer over said dielectric layer and contacting said metal pad;

forming at least one copper post on said at least one redistribution layer forming a land grid array;

cutting said wafer partially through on scribe lines to form cuts exposing sides of said silicon die;

thereafter applying a molding compound over said at least one redistribution layer and in said cuts wherein said molding compound encapsulates top and side surfaces of said silicon die;

thereafter lapping said wafer to expose said at least one copper post;

forming an oxidation preventing layer on exposed said at least one copper post; and thereafter cutting said wafer all the way through on said scribe lines, thereby singulating said wafer to form packages.

11. The method according to claim 10 wherein said applying said molding compound comprises:

compression molding using a mold granular epoxy resin material with a fine filler;

curing; and post-curing said mold material.

12. The method according to claim 10 wherein said oxidation preventing layer comprises organic solderability preservatives (OSP), immersion tin (IT), or electroplated gold coated, printed, or plated onto said exposed at least one copper post.

13. The method according to claim 10 further comprising:

thinning a backside of said wafer prior to said singulating said wafer to form packages.

14. The method according to claim 13 further comprising laminating a backside protection film onto thinned said backside of said wafer prior to said singulating step.

15. The method according to claim 14 wherein said backside protection film comprises epoxy.

* * * * *